(12) United States Patent
Bell et al.

(10) Patent No.: US 12,000,733 B2
(45) Date of Patent: Jun. 4, 2024

(54) APPARATUS AND METHOD FOR ENHANCING THE SAFETY OF LASER BASED SYSTEMS

(71) Applicant: INTELLIGENT MATERIAL SOLUTIONS, INC., Princeton, NJ (US)

(72) Inventors: Howard Y. Bell, Princeton, NJ (US); Joshua E. Collins, Princeton, NJ (US); Victor Zazzu, Belle Mead, NJ (US); Wenyu Hu, Princeton, NJ (US)

(73) Assignee: INTELLIGENT MATERIAL SOLUTIONS, INC., Princeton, NJ (US)

( * ) Notice: Subject to any disclaimer, the term of this patent is extended or adjusted under 35 U.S.C. 154(b) by 301 days.

(21) Appl. No.: 17/604,846

(22) PCT Filed: Apr. 17, 2020

(86) PCT No.: PCT/US2020/028703
§ 371 (c)(1),
(2) Date: Oct. 19, 2021

(87) PCT Pub. No.: WO2020/214923
PCT Pub. Date: Oct. 22, 2020

(65) Prior Publication Data
US 2022/0221334 A1 Jul. 14, 2022

Related U.S. Application Data

(60) Provisional application No. 62/836,365, filed on Apr. 19, 2019.

(51) Int. Cl.
*G01J 1/58* (2006.01)
*G01J 1/04* (2006.01)
*H01S 5/00* (2006.01)
*H01S 5/042* (2006.01)

(52) U.S. Cl.
CPC .............. *G01J 1/58* (2013.01); *G01J 1/0425* (2013.01); *H01S 5/0087* (2021.01); *H01S 5/042* (2013.01)

(58) Field of Classification Search
CPC ......... G01J 1/58; G01J 1/0425; H01S 5/0087; H01S 5/042; H01S 5/0427;
(Continued)

(56) References Cited

U.S. PATENT DOCUMENTS

2004/0254769 A1  12/2004  Miyairi et al.
2010/0177929 A1*  7/2010  Kurtz ................... H04N 9/3194
                                                      382/173
(Continued)

FOREIGN PATENT DOCUMENTS

WO    2018102467 A1    6/2018

OTHER PUBLICATIONS

The Extended European Search Report for corresponding European application No. 20790453, dated Dec. 5, 2022.
(Continued)

*Primary Examiner* — Kiho Kim
(74) *Attorney, Agent, or Firm* — MEAGHER EMANUEL LAKS GOLDBERG & LIAO, LLP (57) ABSTRACT

Disclosed is a hand-held optical apparatus and method for using the apparatus to activate and detect optical emissive materials as part of a safety interlock system. Typically, the hand-held optical apparatus will include one or more light sources capable of emitting at least one wavelength of light towards an optical emissive material, a light detector capable of detecting a response from the optical emissive material, and control circuitry configured to cause at least one of the one or more light sources to emit the at least one wavelength at a power density less than a predetermined threshold, receive a signal from the light detector representing a
(Continued)

detected response, and repeat until the microprocessor determines the detected response matches an expected response.

13 Claims, 4 Drawing Sheets

(58) Field of Classification Search
CPC .............. H01S 5/06825; H01S 5/4087; G01N 21/6408; G01N 2201/0221; G01N 2021/637; G01N 21/636
See application file for complete search history.

(56) References Cited

U.S. PATENT DOCUMENTS

| | | |
|---|---|---|
| 2015/0230864 A1 | 8/2015 | Xuan et al. |
| 2015/0338728 A1* | 11/2015 | Amron ............... G03B 21/2053 33/286 |
| 2016/0025560 A1 | 1/2016 | Hamamoto |
| 2018/0321144 A1 | 11/2018 | Kotidis et al. |

OTHER PUBLICATIONS

Ohdaira, T. and Nagai, H., "Intraoperative localization of early-stage upper gastrointestinal tumors using a magnetic marking clip-detecting system", Surgical Endoscopy and Other Interventional Techniques (2007), 810-815, vol. 21, Springer Science+Business Media, Inc.

International Search Report and Written Opinion for corresponding PCT Application No. PCT/US2020/028703, dated Jul. 21, 2020.

\* cited by examiner

APPARATUS AND METHOD FOR ENHANCING THE SAFETY OF LASER BASED SYSTEMS

CROSS-REFERENCE TO RELATED APPLICATIONS

This application claims priority to U.S. Provisional Patent Application No. 62/836,365, filed on Apr. 19, 2019, which is hereby incorporated by reference in its entirety.

BACKGROUND OF THE INVENTION

Light emissive crystalline structures come in a variety of different style shapes and with varying optical properties. To activate such materials, a light source (such as a laser) is typically utilized—light having a first peak wavelength from the light source is absorbed by the material, and the material emits a light having a different peak wavelength.

However, the light having a peak wavelength that is absorbed by the material can be unsafe for, e.g., human eyes. If the light source is not directed solely at one of the light emissive crystalline structures, a user can injury herself or another individual.

As such, an apparatus and method for improving the safety of laser-based systems is desirable.

BRIEF SUMMARY

A first aspect of the present disclosure is drawn to a hand-held optical apparatus with enhanced safety. The apparatus includes one or more light sources, a light detector, and a microprocessor. The light source is capable of emitting at least one wavelength of light at an optical emissive material. The light detector is capable of detecting a response from the optical emissive material. The microprocessor is configured to: (i) cause at least one of the one or more light sources to emit the at least one wavelength at a power density less than a predetermined threshold, (ii) receive a signal from the light detector representing the detected response, and (iii) repeat (i) and (ii) until the microprocessor determines the detected response matches an expected response.

In certain embodiments, the one or more light sources comprises or consists of one or more lasers. In certain embodiments, at least one light source is an IR or visible light laser, and the IR or visible light laser is adapted to emit a wavelength at which an optical emissive material in the optical path of the IR or visible light laser is responsive.

The apparatus may optionally include an optical fiber positioned to receive light from at least one of the one or more light sources and direct the received light towards a target.

The apparatus may optionally include a detection circuit that uses LED illumination, or visible laser illumination having one or more wavelengths.

The apparatus may optionally include a magnetometer.

The microprocessor's determination that the detected response matches an expected response may optionally include identifying and characterizing the optical emissive material(s) based on time rise, time decay, power dependency, spectral absorption, spectral emission, or a combination thereof. The determination may optionally include detecting a response from the optical emissive material(s) with a magnetometer, and identifying or classifying the rare earth optical emissive material based on the detected magnetometer response.

A second aspect of the present disclosure is drawn to a method for enhancing the safety of laser-based systems. Using a hand-held optical apparatus as described above, an optical emissive material is illuminated with at least one of the one or more light sources, a response from the rare earth optical emissive material is detected, and the hand-held optical apparatus is prevented from emitting light at power densities unsafe for humans until the detected response matches a predetermined expected response.

The optical emissive material may be illuminated by at least one wavelength in the IR or visible light region. In certain embodiments, the optical emissive material is illuminated by at least two light sources simultaneously.

BRIEF DESCRIPTION OF THE DRAWINGS

In the accompanying drawings, which are not drawn to scale, like reference characters denote like components.

DETAILED DESCRIPTION OF THE INVENTION

The present disclosure is drawn to a method and apparatus that, when used, will greatly improve the safety when using laser pointers for the purpose of illuminating and detecting optical emissive materials.

Many common devices use lasers, such as infrared lasers, that can be greater than 50 mW of optical power and with quite a long focal distance. An example of such is a typical laser pointer, sold commercially in many locations, which are Class IIIB, and are not eye-safe laser pointers. The high power densities of these lasers (power density being the power of the laser per unit area, which can be measured in $mW/cm^2$), represents a possible safety hazard, and the fact that the IR illumination is invisible to the eye raises the risks even further. For example, even if not done intentionally, there is a chance of looking directly into the output of an IR laser. Other lasers, including those in medical or industrial applications, may be unsafe due to the actual power of the laser, rather than the power density. These lasers can be used to irradiate optical emissive materials which may, e.g., fluoresce at different frequencies in the visible spectra. However, in order to have a bright enough emission from the optical emissive material phosphor, the laser preferably needs to exceed 2 $mW/cm^2$. Such a high power density laser is not commercially useful without some sort of safety interlock.

As used herein, "safe" light sources are those that are generally regarded as not posing substantial hazards to human eyes, either due to power, frequency, or period of exposure. The IEC 60825-1 standard laser classification system specifies four classes for lasers emitting light in wavelengths from 180 nm to 1 mm. Broadly speaking, classes 1 and 2 are considered "safe" lasers. For non-laser light sources, the IEC 62471-2006 standard specifies four classifications (risk groups) for lamps and lamp systems emitting light in wavelengths from 200-3000 nm. Broadly speaking, the exempt, RG-1, and RG-2 risk groups are considered "safe" light sources. Even some light sources outside the classes described above can fall into the "safe" category, if configured to be used for a sufficiently brief period of time. "Unsafe" light sources include all other light sources besides "safe" light sources.

Disclosed is a hand-held optical apparatus with such an interlock feature, that eliminates the possibility of a user accidentally causing damage to themselves and or anyone else. In order to utilize such a safety interlock, detection circuitry is needed that will safely detect the presence of an optical emissive material before the unsafe light source(s) are enabled. Once the optical emissive material is detected, the unsafe light source(s) can be enabled for a specified brief period of time. After the specified brief time period the laser is disabled, and the detection circuitry will then check for the presence of the optical emissive material again and the cycle is then repeated. These specified brief periods are very short (e.g., <100 msec, <10 msec, <1 msec, <100 μsec, <50 μsec, or <10 μsec), making it near impossible for an operator of the hand-held optical apparatus to even move the laser to point at his own eye or move the laser to accidentally point at another person.

Figure 1A:
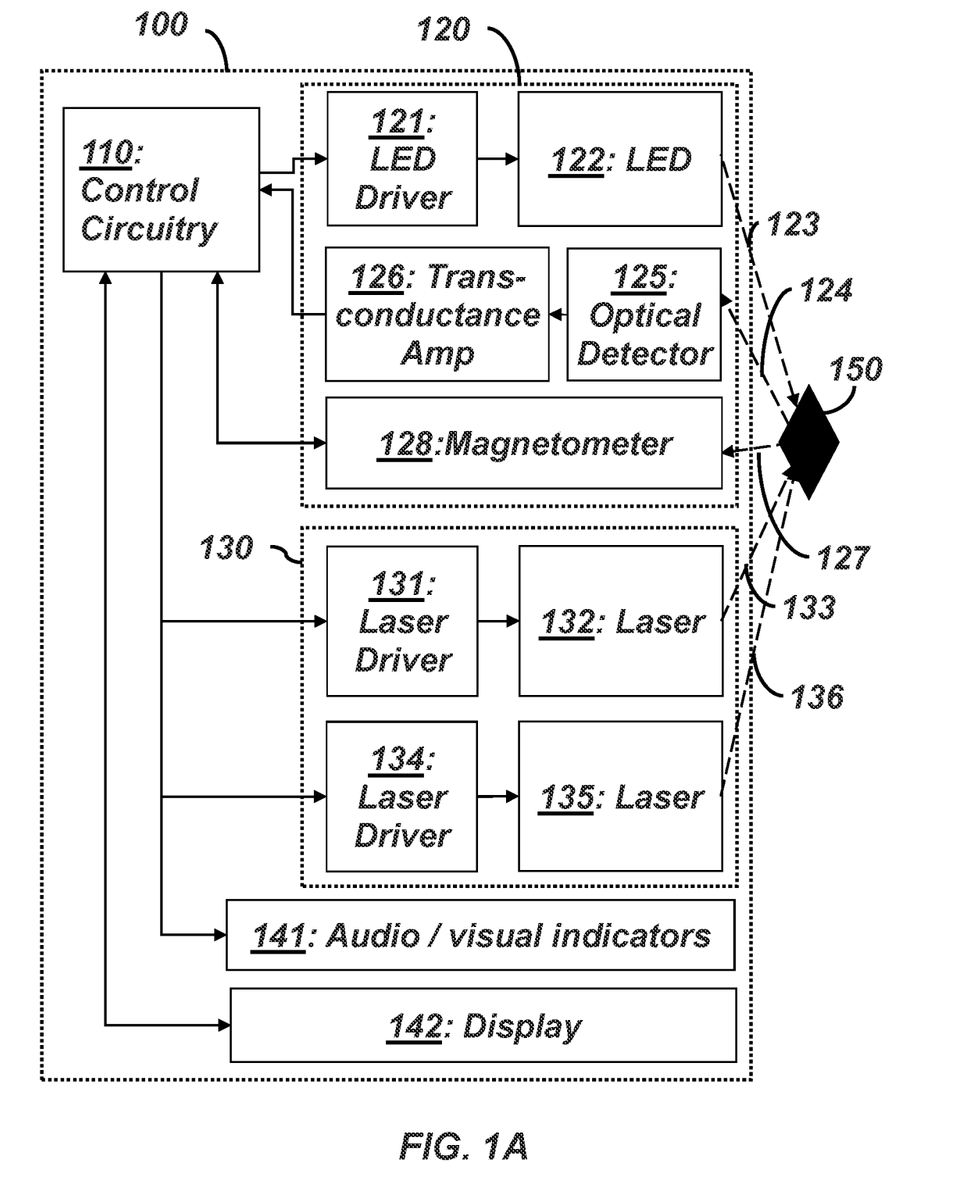
FIGS. 1A and 1B are block diagrams of embodiment according to the present disclosure.

As seen in FIG. 1A, embodiments of the hand-held optical apparatus 100 includes control circuitry 110, which may be a separate stand-alone computer, tablet, and/or one or more microcontrollers (each of which may include, e.g., a processor, memory, and I/O peripherals on a signal chip) that interacts with the other components on the hand-held optical apparatus 100. At a minimum, the control circuitry 110 is operably connected to eye-safe detection circuitry 120 and the unsafe light sources 130.

The hand-held optical apparatus 100 also includes one or more light sources 122, 132, 135 that are operably connected to the control circuitry 110, and each light source is capable of emitting at least one wavelength of light 123, 133, 136 towards a surface with an optical emissive material 150 that is in or on the surface, in order to cause the optical emissive material 150 to emit a detectable wavelength of light 124.

The lights sources may be any suitable light source, such as an electroluminescent device, a cold cathode fluorescent lamp, an electrodeless fluorescent lamp, an LED, an organic electroluminescent device (OLED), a polymer LED, a laser diode, an arc lamp, a semiconductor laser, and the like. As used herein, the term "LED" refers to a diode that emits light, whether coherent or non-coherent, whether visible, ultraviolet, or infrared. The terminology as used herein also includes non-coherent epoxy encapsulated semiconductor devices sold as "LEDs" regardless of conventional or superradiant type. As used herein, this term also includes semiconductor laser diodes. In FIG. 1A, the apparatus is shown as using a "safe" visible light LED 122 and two unsafe semiconductor lasers 132, 135. Each light source may be associated with a driver (a circuit used to power the light source). In FIG. 1A, LED 122 is powered by LED driver 121, which is operably connected to the control circuitry 110. The semiconductor lasers 132, 135 are each powered by a laser driver 131, 134, which are each operably connected to the control circuitry 110.

The optical emissive material 150 can be any known material that absorbs light at one frequency and can emit light at a different frequency. Preferably, the optical emissive material is a crystalline structure, such as a phosphor, and more preferably, a class of phosphors comprising rare earth elements (and specifically lanthanides) that have an Anti-Stokes property. In certain embodiments, the optical emissive material 150 is plurality of particles, each of which could be, independently, an optical emissive material. For example, in some embodiments, the optical emissive material includes two or more different phosphors.

Materials having an anti-stokes property will essentially takes the energy from a lower frequency (energy) of light and will then convert that to a higher frequency (energy) of light. Please note that the energy of light at a particular frequency is governed by the following equation E=hf, where E is the energy of the photon and h is Plank's constant ($6.626 \times 10^{-34}$ joules-sec) and f is the frequency of the photon. Therefore, infrared light is lower energy than the emitted visible light. This anti-stokes property is also referred to as "up-converting" (converting to a high frequency). Conversely, when a higher energy light wave impinges on light emissive crystalline structures and a lower energy wave is emitted, it is often referred to as "down-converting."

An example of up-conversion is, if the optical emissive material is illuminated with a laser having a wavelength of 980 nm then depending on the optical emissive material, the material will then emit light in the visible region (roughly about 370 nm to about 740 nm, commonly simplified to 400 nm to 700 nm).

If the optical emissive materials are particles, the optical emissive materials will typically have micron or sub-micron particle sizes.

Referring back to FIG. 1A, the detection circuitry preferably also includes an optical detector 125. The optical detector 125 converts light 124 emitted from the optical emissive material 150 into an electrical signal for measurement and analysis. Any known type of optical detector can be utilized here, including but not limited to thermopile sensors, photodiode sensors, and wavelength sensors. The optical detector 125 is operably connected to the control circuitry 110. In some embodiments, filters or amplifiers may be also be included. For example, in FIG. 1A, a transconductance amplifier 126 is introduced between the optical detector 125 and the control circuitry 110.

The detection circuitry 120 may be provided as separate elements, or may be provided, e.g., as a single chip.

In some embodiments, the optical detector 125 can also differentiate complex optical signals coming from the phosphors when the two lasers are on to provide additional, machine readable information on top of the visual response.

The detection circuitry 120 may include a magnetometer 128, which is configured to detect, e.g., the presence, direction, strength, or relative change of a magnetic field 127 and may indicate the presence of an optical emissive material 150 or can aid in interrogating the optical emissive material 150. In some embodiments, a magnetometer 128 can be used to ensure the laser(s) 132, 135 are directed towards an optical emissive material 150.

In some embodiments, the magnetometer 128 replaces the other components in detection circuitry 120, such as LED 122 and any associated driver such as LED driver 121. In other embodiments, detection circuitry 120 includes both a magnetometer 128 and, e.g., an eye safe light source such as LED 122. In these embodiments, the magnetometer 128 can be used to both ensure the optical emissive material 150 is present, but also to interrogate the optical emissive material 150.

The hand-held optical apparatus 100 may also contain other, optional components. For example, the hand-held optical apparatus 100 may include audio and/or visual indicators 141 operably connected to the control circuitry. Such indicators are typically used to provide indications to a user as to the status of the apparatus. For example, a light may be used as an indicator, which turns red until a target optical emissive material is detected, at which time the light turns green. Alternatively, or in addition to the visual signals, sounds may issue from the hand-held optical apparatus 100. For (for example, a "beep" sound may be used to indicate a target optical emissive material has been detected. Various status items or results may be shown, e.g., on a display 142 which may be, e.g., a part of a separate host computer (not shown). The display may be a touch-sensitive display, and thus, the control circuitry 110 may receive input from the display 142 in order to control the hand-held optical apparatus 100.

Figure 1B:
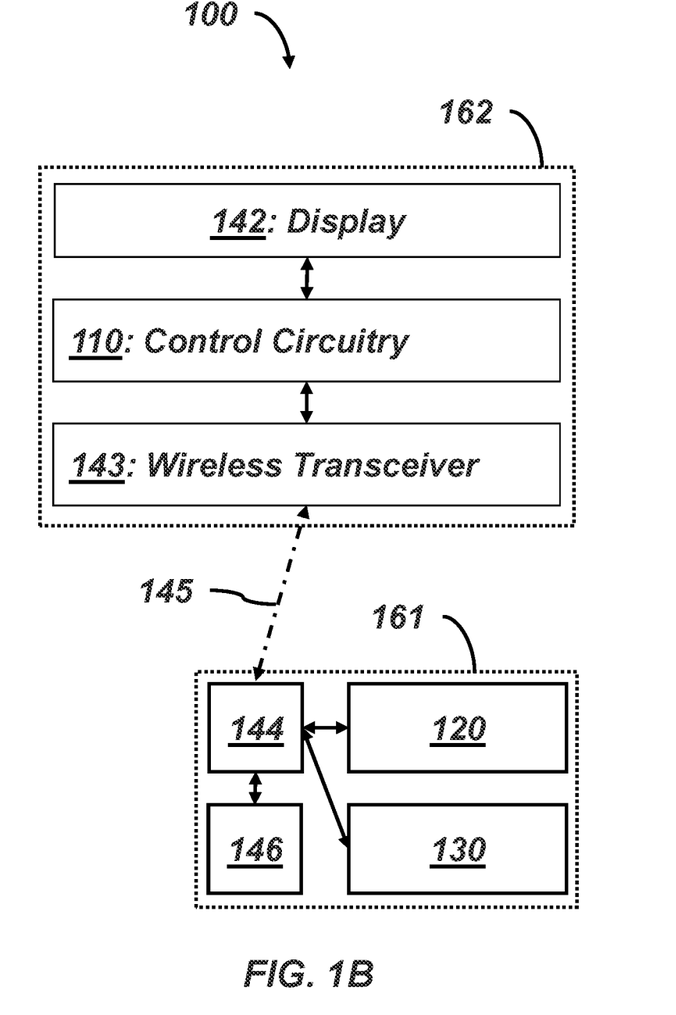

Other configurations are also envisioned. For example, as seen in FIG. 1B, in one embodiment the apparatus may be divided into two or more separate components, including, e.g., a first, manipulatable component (e.g., the portion that is substantially encompassed by housing 161), and a second, relatively stationary component (e.g., laptop 162) that communicate 145 wirelessly through wireless transceivers 143, 144, or via a wired connection (not shown). Although the second component is described as a laptop in FIG. 1B, this second component could alternatively be a desktop computer, a tablet, a mobile phone, or a cloud-based server.

As seen in FIG. 1B, within housing 161, the first, manipulatable portion typically comprises both the safe detection circuitry 120 and the unsafe light sources 130, but may also comprise one or more buttons or controls 146 that can be used to, e.g., turn the apparatus on or off, change settings, etc.

Figure 2:
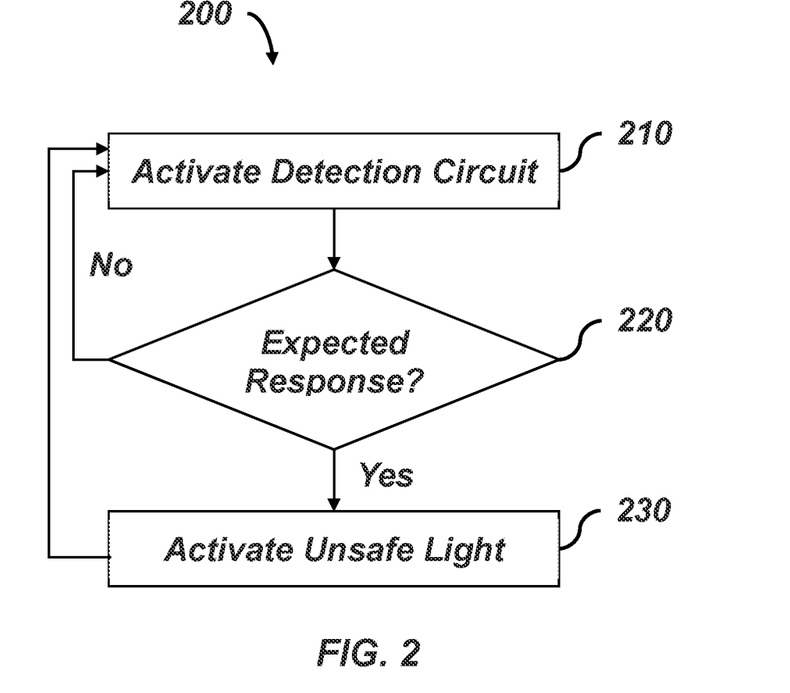
FIG. 2 is an flowchart illustrating one embodiment of a control scheme.

FIG. 2 illustrates a simplified control scheme 200 for a hand-held optical apparatus 100. When the hand-held optical apparatus 100 is activated, control circuitry 110 first causes the detection circuitry 120 to activate. This will typically include activating 210 a safe light source. This may involve, e.g., causing at least one of the one or more light sources to illuminate/irradiate optical emissive material 150 with at least one wavelength of light 123 (e.g., by activating LED driver 121 to power LED 122). That wavelength of light 123 activates the optical emissive material 150. The optical detector 125 detects some response, such as light 124 that is, e.g., reflecting, scattering, and/or emitting from the optical emissive material 150. The detected response is then passed through a transconductance amplifier 105 to control circuitry 110.

Control circuitry 110 may makes a determination 220 as to whether the detected response matches an expected response. In some embodiments, this may include identifying and/or characterizing an optical emissive material based on time rise, time decay, power dependency, spectral absorption, spectral emission, or a combination thereof.

Figure 3:
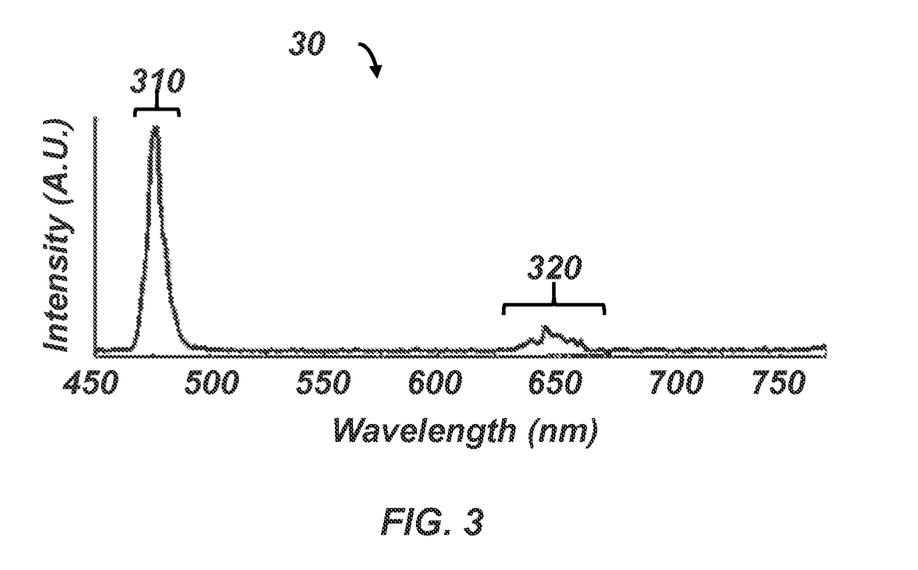
FIG. 3 is a graph illustrating the visible emission of upconverting phosphor Gd2SO2:YbTm when excited with a 980 nm laser.

Referring briefly to FIG. 3, one embodiment of a response 300 is seen, showing the intensities of emitted wavelengths from an optical emissive material irradiated with a 980 nm laser. Here, the control circuitry 110 can make several determinations regarding the response. At a high level, it can see the major feature is a well-defined peak 310 between 465 nm and 490 nm, and determine that this is a blue-emitting optical emissive material. In some embodiments, simply determining the responsive color is sufficient—that is, the expected response was a blue emission, and the response was determined to be blue. In other embodiments, the shape of the response may be normalized and compared to a predetermined target response, and if the differences are not statistically significant, the response is determined to match the predetermined target response. In some embodiments, the control circuitry may find the peak wavelength (here, about 477 nm), and may examine feature 320 located between 630 nm and 675 nm, and determine that this response matches, e.g., the response for a Gd2SO2:YbTm phosphor, and thus can identify the optical emissive material.

Referring back to FIG. 2, if the control circuitry 110 determines that no response has been received, or the detected response does not match the expected response, the hand-held optical apparatus 100 repeats the activation 210 of detection circuitry 120, until the user stops trying to activate the apparatus, until a predetermined number of attempts has been made, or until a predetermined amount of time has elapsed. In this case, the system has prevented the hand-held optical apparatus from emitting light at power densities unsafe for humans until the response matches a predetermined expected response. In such cases, a warning or notification may be made, indicating to the user that something has gone wrong, and the hand-held optical apparatus was not able to use the unsafe light source.

On the other hand, if the response matches an expected response, the control circuitry 110 activates 230 the unsafe light source(s). This may include, e.g., instructing the laser driver(s) 131, 134 to provide power to the laser(s) 132, 135. The laser light 133, 136 is pulsed for a predetermined brief period of time (e.g., <100 msec, <10 msec, <1 msec, <100 μsec, <50 μsec, or <10 μsec), then is turned off, and then activating 210 the detection circuitry again. While the apparatus is in use, the above steps are repeated to ensure the apparatus is still pointing to the sample and not, e.g., an eye.

Results may then be shown, e.g., on display 142 which may be, e.g., a part of a separate host computer (not shown).

EXAMPLE 1

In accordance with one aspect of the invention, the detection circuitry uses a set of eye safe infrared (IR) LEDs to excite an optical emissive material, the apparatus also uses an unsafe, high powered IR laser. The method used to detect the presence of the optical emissive material, as opposed to merely looking at the fluorescence of visible optical light, uses another property of some optical emissive materials, such as rare earth optical emissive materials, where the material will fluoresce for a short time duration after it has stopped being illuminated. This time duration can last from 10 μsec to several hours depending on the exact optical emissive material being detected, concentration etc. A microprocessor in the detection system can then be programmed to detect the duration of the time decay and determine if the sensor circuitry is focused on the appropriate optical emissive material.

Figure 4:
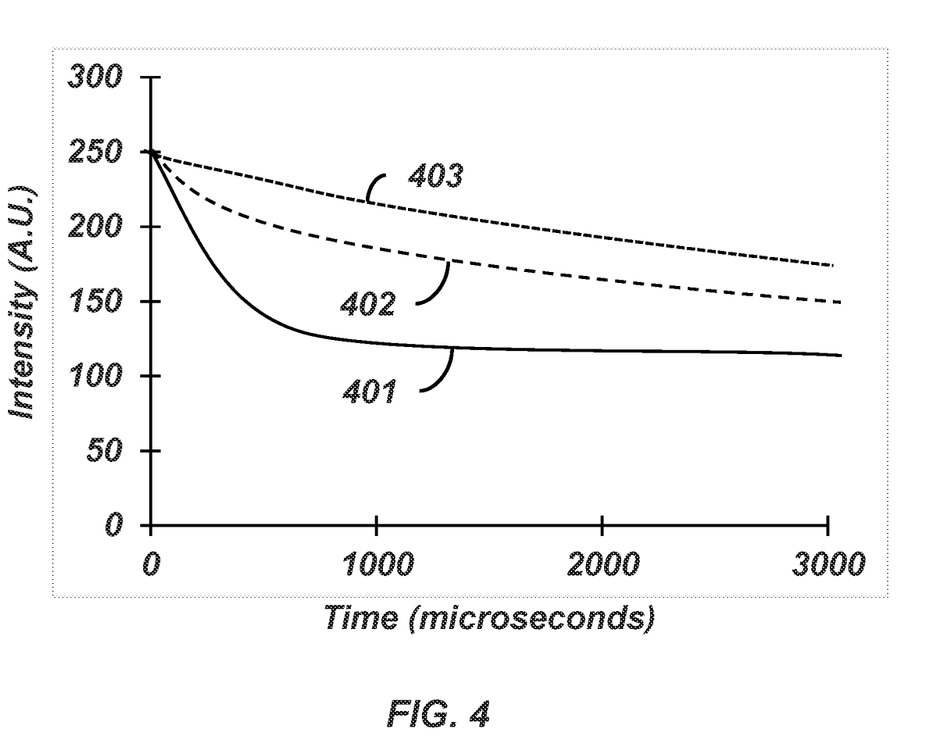
FIG. 4 is a graph illustrating a time decay signal from an optical emissive material.

As seen in FIG. 4, the solid black line 401 indicates the very short decay time of one optical emissive material. The long-dashed lined 402 and short dashed line 403 indicate decay times of more preferred optical emissive materials. As can be seen, the short-dashed line 403 has a long decay time, the long-dashed lined 402 has an intermediate decay time. By matching the detected decay times to an expected decay time, the system can determine whether the apparatus is pointed at the correct target.

Since the total time needed to make the determination is quite fast, relative the ability for a human to perceive such action, then when the system switches back and forth between detection and unsafe light source use, the unsafe light source essentially looks like it is on all the time. However, once the apparatus and/or the optical emissive material are physically moved away from each other, the unsafe light source will be disabled. Since the scan speed is relatively fast then it appears to the user that the unsafe light source is going off essentially instantly. Once the unsafe light source has been turned off then the apparatus will return to the mode where it is trying to detect the presence of the optical emissive material by using the set of safe IR LEDs. An advantage of this method in the use of anti-counterfeiting application is the fact that the user is indeed using IR illumination and the fact that it is invisible to eye makes it difficult for the casual counterfeiter trying to duplicate the system.

EXAMPLE 2

While the use of separate, eye safe LED illumination is preferred in the detection circuit, the eye-safe LED function can be replaced by with a single laser that is pulsed for a very short duration during the detection phase of the above embodiment. For example, a single laser, operating at 980 nm, can be used to illuminate the optical emissive material to allow the visible portion of the optical emissive material to fluoresce in a manner that can be seen by the user.

Alternatively, the power level of the laser could be modulated. That is, the single laser could operate at a low power setting during the detection phase and a higher power setting at other times. This can be done by, e.g., forming an optical automatic gain control (AGC) system using the optical power of the laser as the modulation medium, or other techniques as known to those of skill in the art. In certain embodiments, the power of the laser is set at a point where it is just able to detect the optical emissive material.

EXAMPLE 3

In accordance with another embodiment of the invention, the detection circuitry uses a visible laser to excite the optical emissive material. In this embodiment of the invention a visible laser is used to enhance the ability of the user to point to where it is believed the embedded optical emissive material may actually be. This enhances the user experience since, when using an IR laser, the user really can only guess as to the precise location of the interrogating light source. Since the optical emissive material may have some down-converting properties, the optical emissive material may emit light in the IR region. The use of a visible laser eliminates the use of an invisible (e.g., IR) light source for both detection and optical emissive material viewing which cannot be seen by the user. In an example where the optical emissive material may be responsive to both green and red visible light illumination in the down-converting mode, the detection system might operate in the following manner:
(1) The detection circuitry first begins to pulse red light at the optical emissive material; and
(2) The apparatus then checks for a return signal that has the appropriate optical time decay for red illumination. This method is similar to that uses with the IR LEDs in Example 1, but the apparatus is using (in this specific example) a red laser light source.
(3) If the expected time decay response of the optical emissive material is detected, then the detection circuitry will then switch to the green laser. The presence of the green laser is simply indicative of the fact that the expected optical emissive material was detected by the red laser. The next step is different from Example 1 in that the green laser will pulse the optical emissive material and the apparatus will check for another time decay. This action occurs faster than that can be visually perceived by looking at the laser. Therefore, the green laser light that is illuminating the optical emissive material will appear, to the user, as if it is on constantly. Once the green light is moved off of the optical emissive material, the detection circuitry will sense that fact and then switch back to the pulsing of the red laser and search for the optical emissive material. One advantage of using a visible or IR laser as opposed to the LEDs in Example 1 is that the laser can be focused at a further distance from the apparatus than the LEDs, and thus can offer the user a greater working distance.

EXAMPLE 4

In accordance with another embodiment of the invention, the detection circuitry uses a set of eye safe LED's to excite the optical emissive material. The method used to detect the presence of the optical emissive material uses a rise time property of the optical emissive material. The amount of time the optical emissive material takes to achieve a peak intensity can be measured. Pulsing the LED at the correct timing with the rise time of the optical emissive material allows for precise identification of the material. This rise time duration can be from, e.g., 1 µsec to 10 ms depending on the type of optical emissive material being detected, concentration, etc. The control circuitry can then be programmed to measure the duration of the rise time and determine if the apparatus is focused on the appropriate optical emissive material. Since the total time needed to make the determination is quite fast, relative the ability for a human to perceive such action, then when the system switches back and forth between detection and unsafe laser usage, the laser essentially looks like it is on all the time. However, once the apparatus and/or the optical emissive material are physically moved away from each other (e.g., separated by a distance of >1 cm, >2 cm, >3 cm, >4 cm, >5 cm, the laser will be disabled. Since the scan speed is relatively fast then it appears to the user that the laser is going off essentially instantly. Once the unsafe light source has been turned off then the apparatus will return to the mode where it is trying to detect the presence of the optical emissive material.

EXAMPLE 5

In accordance with another embodiment of the invention, the detection circuitry uses a visible laser to excite the optical emissive material. In this embodiment of the invention a visible laser is used to enhance the ability of the user to point to where it is believed the embedded optical emissive material may actually be. Since the optical emissive material may have some down-converting properties then the optical emissive material will emit light in the IR region. The use of a visible laser eliminates the use of an invisible (IR) light source for both detection and optical emissive material viewing which cannot be seen by the user. Since the optical emissive material may be responsive to both green and red illumination in the down-converting mode, the detection system can operate in the following manner:
(1) The detection circuitry first begins to pulse red light at the optical emissive material; and
(2) The device then checks for a return signal that has the expected optical time rise and/or decay.
(3) If the expected time rise or decay response of the optical emissive material is detected then the device will then turn start modulating one or more other lasers, such as an 800 nm laser, a 980 nm laser and/or a 1550 nm laser. This action occurs faster than that can be visually perceived by looking at the laser. The apparatus will modulate the lasers and make a to determine which optical emissive material is present. A predetermined set of spectral, temporal and power dependence properties are evaluated. Once the determination is made as to what material is present the system puts out an unsafe green light and also displays the decoded information either by projecting with the green laser or relaying via Bluetooth to a portable device. Once the unsafe green light is moved off of the optical emissive material then the time rise and/or decay detection circuitry will sense that fact and then switch back to the pulsing of the red laser and search for the optical emissive material as when we started this process.

EXAMPLE 6

In this embodiment, the detection circuitry uses a magnetometer to identify a magnetic material present in the sample. The method used to detect the presence of the magnetic material uses the magnetic property of some of the optical emissive material. The presence of a magnetic field in some of the optical emissive material allows for precise identification of the material. It also provides an additional safety check—there is little chance of a person having metal or a magnetic field in or around their eyeball. The apparatus can be programmed to detect the magnetic field. However, once the detection device and/or the optical emissive material are physically moved away from each other, the laser will be disabled. Since the scan speed is relatively fast then it appears to the user that the laser is going off essentially instantly. Once the IR laser has been turned off then the device will return to the mode where it is trying to detect the presence of the optical emissive material by using the magnetometer.

Those skilled in the art will recognize or be able to ascertain using no more than routine experimentation, many equivalents to the specific embodiments of the invention described herein. Such equivalents are intended to be encompassed by the following claims.

What is claimed is:

1. A method for enhancing safety of laser-based systems, comprising:
   providing a hand-held optical apparatus comprising:
      one or more light sources capable of emitting at least one wavelength of light towards an optical emissive material;
      a light detector capable of detecting a response from the optical emissive material; and
      control circuitry configured to:
         cause at least one of the one or more light sources to emit the at least one wavelength at a power density less than a predetermined threshold;
         receive a signal from the light detector representing a detected response; and
         repeat until the control circuitry determines the detected response matches an expected response;
   illuminating an optical emissive material with at least one of the one or more light sources;
   detecting a response from the optical emissive material; and
   preventing the hand-held optical apparatus from emitting light at power densities unsafe for humans until the response matches a predetermined expected response.

2. The method according to claim 1, wherein the optical emissive material is illuminated by at least one wavelength in an IR region.

3. The method according to claim 1, wherein the optical emissive material is illuminated by at least one wavelength in a visible light region.

4. The method according to claim 1, wherein the optical emissive material is illuminated by at least two light sources simultaneously.

5. The method according to claim 1, wherein at least one of the one or more light sources is a laser.

6. The method according to claim 1, wherein at least one of the one or more light sources is an IR laser, and the IR laser is adapted to emit a wavelength at which an optical emissive material in an optical path of the IR laser is responsive.

7. The method according to claim 1, wherein at least one of the one or more light sources is a visible light laser, and the visible light laser is adapted to emit a wavelength at which an optical emissive material in an optical path of the visible light laser is responsive.

8. The method according to claim 1, wherein the hand-held optical apparatus further comprises an optical fiber positioned to receive light from at least one of the one or more light sources and direct the light towards a target.

9. The method according to claim 1, wherein the hand-held optical apparatus further comprises a detection circuit that uses LED illumination.

10. The method according to claim 1, wherein the hand-held optical apparatus further comprises a detection circuit that uses visible laser illumination having one or more wavelengths.

11. The method according to claim 1, wherein determining the detected response matches an expected response includes identifying and characterizing the optical emissive material based on time rise, time decay, power dependency, spectral absorption, spectral emission, or a combination thereof.

12. The method according to claim 1, wherein the hand-held optical apparatus further comprises a magnetometer.

13. The method according to claim 12, wherein determining the detected response matches an expected response includes detecting a response from the optical emissive material with the magnetometer, and identifying or classifying the optical emissive material based on the detected response from the magnetometer.

* * * * *